United States Patent
Bansal et al.

(10) Patent No.: US 9,897,651 B2
(45) Date of Patent: Feb. 20, 2018

(54) ULTRA-FAST AUTONOMOUS CLOCK MONITORING CIRCUIT FOR SAFE AND SECURE AUTOMOTIVE APPLICATIONS

(71) Applicant: QUALCOMM Incorporated, San Diego, CA (US)

(72) Inventors: Virendra Bansal, Bangalore (IN); Rahul Gulati, Bangalore (IN); Palkesh Jain, Bangalore (IN); Roberto Avanzi, Munich (DE)

(73) Assignee: QUALCOMM Incorporated, San Diego, CA (US)

( * ) Notice: Subject to any disclaimer, the term of this patent is extended or adjusted under 35 U.S.C. 154(b) by 100 days.

(21) Appl. No.: 15/059,341

(22) Filed: Mar. 3, 2016

(65) Prior Publication Data

US 2017/0255223 A1    Sep. 7, 2017

(51) Int. Cl.
| | | |
|---|---|---|
| *G01R 31/317* | (2006.01) | |
| *G06F 1/04* | (2006.01) | |
| *H03K 3/037* | (2006.01) | |
| *H03K 5/14* | (2014.01) | |
| *G01R 31/319* | (2006.01) | |
| *H03K 5/00* | (2006.01) | |

(52) U.S. Cl.
CPC . *G01R 31/31727* (2013.01); *G01R 31/31922* (2013.01); *G06F 1/04* (2013.01); *H03K 3/037* (2013.01); *H03K 5/14* (2013.01); *H03K 2005/00058* (2013.01)

(58) Field of Classification Search
None
See application file for complete search history.

(56) References Cited

U.S. PATENT DOCUMENTS

| | | | | |
|---|---|---|---|---|
| 4,081,662 A | * | 3/1978 | Pehrson | G06F 11/0751 714/814 |
| 6,983,394 B1 | * | 1/2006 | Morrison | G01R 31/31708 713/500 |
| 7,684,533 B2 | * | 3/2010 | Eckhardt | H03L 7/08 375/371 |
| 8,020,026 B1 | | 9/2011 | Khlat et al. | |

(Continued)

FOREIGN PATENT DOCUMENTS

JP    H0854481 A    2/1996

OTHER PUBLICATIONS

International Search Report and Written Opinion—PCT/US2017/015992—ISA/EPO—dated May 12, 2017.

*Primary Examiner* — Steve Nguyen
(74) *Attorney, Agent, or Firm* — The Marbury Law Group, PLLC

(57) ABSTRACT

Various aspects include a clock monitoring unit/component that is configured to repeatedly/continuously monitor a clock with the speed required to support automobile automation systems without the use of a reference clock. The clock monitoring unit/component may be configured to identify, report, and/or respond to variations or abnormalities in the monitored clock, and initiate an action to prevent the variation from causing or resulting in a failure or a vulnerability to attack. The clock monitoring unit/component in the various aspects may be configured, organized, or arranged to operate so that the circuit is immune or resistant to manipulation, modification, tampering, hacks, and other attacks.

18 Claims, 7 Drawing Sheets

(56) References Cited

U.S. PATENT DOCUMENTS

| | | | |
|---|---|---|---|
| 8,937,496 B1 | 1/2015 | Ahmad et al. | |
| 2007/0210846 A1* | 9/2007 | Wang | H03K 5/135 |
| | | | 327/276 |
| 2008/0181046 A1 | 7/2008 | Vergnes et al. | |
| 2009/0183046 A1* | 7/2009 | Jun | G01R 31/31727 |
| | | | 714/744 |
| 2014/0015562 A1* | 1/2014 | Dwivedi | G11C 7/08 |
| | | | 324/762.03 |
| 2014/0184243 A1 | 7/2014 | Iyer et al. | |
| 2014/0340130 A1 | 11/2014 | Machnicki et al. | |
| 2015/0033061 A1* | 1/2015 | Yu | G06F 21/50 |
| | | | 713/501 |
| 2016/0033576 A1 | 2/2016 | Turullols et al. | |
| 2016/0034014 A1* | 2/2016 | Turullols | G01R 31/31725 |
| | | | 713/320 |
| 2017/0163152 A1* | 6/2017 | Holzmann | G05F 1/462 |

* cited by examiner

ULTRA-FAST AUTONOMOUS CLOCK MONITORING CIRCUIT FOR SAFE AND SECURE AUTOMOTIVE APPLICATIONS

BACKGROUND

Over the past several years, the modern automobile has transformed from a self-propelled mechanical vehicle into a powerful and complex electro-mechanical system that includes a large number of processors, sensors, and systems-on-chips (SOCs) that control many of the vehicle's functions, features, and operations. More recently, manufacturers have begun equipping automobiles with Advanced Driver Assistance Systems (ADASs) that automate, adapt, or enhance the vehicle's operations. For example, an ADAS may be configured to use information collected from the automobile's sensors (e.g., accelerometer, radar, lidar, geo-spatial positioning, etc.) to automatically detect a potential road hazard, and assume control over all or a portion of the vehicle's operations (e.g., braking, steering, etc.) to avoid detected hazards. Features and functions commonly associated with an ADAS include adaptive cruise control, automated lane detection, lane departure warning, automated steering, automated braking, and automated accident avoidance.

Due to the speed at which automobiles travel, and the significant risk automobiles pose to passenger and pedestrian lives, today's automobiles are increasingly dependent on the speed, accuracy, safety, and security of the embedded electronic components. Speed, accuracy, safety, and security are particularly important in the SOCs that are used for automotive applications, such as the SOCs that include or control a vehicle's ADAS. Accordingly, new and improved circuits, components, systems, and solutions that better meet these and other demands of modern and future automobiles, including self-driving and autonomous vehicles, will be beneficial to car manufacturers, automotive engineers, consumers, and pedestrians.

SUMMARY

The various aspects include clock monitoring circuits, which may include a plurality of cascaded flops in which a clock input of each flop is the same as a clock to be monitored, and the data input of each flop is driven by a divided version of the clock being monitored so that the data input to each of the plurality of cascaded flops is delayed relative to other cascaded flops via one or more programmable delay elements. Aspect clock monitoring circuits may further include an encoder coupled to outputs of the cascaded flops and configured to generate an encoded output value that represents the outputs of the cascaded flops, a comparator configured to generate and store an interrupt when the encoded output value does not match a programmed value, and an error correction code generator configured to generate and store an error correction code for each stored interrupt.

In an aspect, the plurality of cascaded flops and programmable delay elements may be included in a clock monitoring component and configured so that the clock to be monitored is evaluated at least once in every fault tolerant time interval (FTTI). In a further aspect, the clock to be monitored may be a clock that is configured to be included in a control system of a motor vehicle (e.g., an autonomous vehicle, etc.). In a further aspect, the clock to be monitored may be a clock that is configured to be included in a system on chip (SOC) configured to control an operation of an Advanced Driver Assistance System (ADAS) for a motor vehicle.

In a further aspect, the clock monitoring circuit may include a built-in self-test selector component that is coupled to a system clock and the clock to be monitored. In a further aspect, the error correction code generator may be configured to generate the error correction code in response to determining that the interrupt has been stored in a status register. In a further aspect, the error correction code generator may be configured to generate a second error correction code in response to determining that information has been written to a configuration register. In a further aspect, the clock monitoring circuit may include a manager component that is configured to generate an error signal based on the interrupt and the error correction code. In a further aspect, the clock monitoring circuit may include a manager component that is configured to determine whether the clock to be monitored (or monitored clock) is operating correctly or as expected without the use of a reference clock.

Further aspects may include methods of monitoring a clock with a circuit monitoring component, including configuring the clock to be monitored, configuring a plurality of delay elements in the circuit monitoring component, clearing a plurality of flops in the circuit monitoring component, passing a clock pulse from the clock through the plurality of delay elements and the plurality of flops and waiting until the plurality of flops in the circuit monitoring component are loaded, encoding loaded flop values to generate an encoded value, determining whether the encoded value matches a programmed value, and generating an interrupt in response to determining that the encoded value matches does not match the programmed value.

Some aspect methods may include repeating operations of clearing the plurality of flops, passing the clock pulse through the plurality of delay elements and the plurality of flops, encoding the loaded flop values and determining whether the encoded value matches the programmed value in response to determining that the encoded value matches does not match the programmed value. Some aspect methods may include determining whether a power-on self test is enabled, and performing a self test in response to determining that the power-on self test is enabled. In some aspects, performing a self test may include configuring an expected count, clearing the plurality flops in the circuit monitoring component, generating a clock pulse circuit monitoring component and waiting until the plurality of flops are loaded, encoding loaded flop values to generate an encoded value, determining whether the encoded value matches the expected count and whether an interrupt has been asserted, determining that the self test is complete and failed in response to determining that the encoded value matches the expected count and an interrupt has been asserted, and determining that the self test is complete and passed in response to determining that the encoded value does not match the expected count or that an interrupt has not been asserted. Some aspect methods may include determining whether the clock to be monitored is operating correctly without the use of a reference clock. Some aspect methods may include generating an error correction code in response to determining that the interrupt has been stored in a status register.

Further aspects may include clock monitoring circuits that include a plurality of flops, a plurality of delay elements, each of which is coupled to one of the plurality of flops, means for configuring a clock to be monitored, means for configuring the plurality of delay elements, means for clearing the plurality of flops, means for passing a clock pulse from the clock through the plurality of delay elements and the plurality of flops and waiting until the plurality of flops are loaded, means for encoding loaded flop values to generate an encoded value, means for determining whether the encoded value matches a programmed value, and means for generating an interrupt in response to determining that the encoded value matches does not match the programmed value.

In some aspects, the clock monitoring circuit may further include means for repeating operations of clearing the plurality of flops, passing the clock pulse through the plurality of delay elements and the plurality of flops, encoding loaded flop values and determining whether the encoded value matches the programmed value in response to determining that the encoded value matches does not match the programmed value. In some aspects, the clock monitoring circuit may include means for determining whether a power-on self test is enabled, and means for performing a self test in response to determining that the power-on self test is enabled.

In some aspects, means for performing a self test includes means for configuring an expected count, means for clearing the plurality flops, means for generating a clock pulse circuit monitoring component and waiting until the plurality of flops are loaded, means for encoding loaded flop values to generate an encoded value, means for determining whether the encoded value matches the expected count and whether an interrupt has been asserted, means for determining that the self test is complete and failed in response to determining that the encoded value matches the expected count and an interrupt has been asserted, and means for determining that the self test is complete and passed in response to determining that the encoded value does not match the expected count or that an interrupt has not been asserted. In some aspects, the clock monitoring circuit may include means for determining whether the clock to be monitored is operating correctly without the use of a reference clock. In some aspects, the clock monitoring circuit may include means for generating an error correction code in response to determining that the interrupt has been stored in a status register.

Further aspects may include a system on chip that includes a clock to be monitored and a clock monitoring circuit coupled to the clock to be monitored. The clock monitoring circuit may include a plurality of cascaded flops in which a clock input of each flop is the same as the clock to be monitored, and the data input of each flop is driven by a divided version of the clock being monitored so that the data input to each of the plurality of cascaded flops is delayed relative to other cascaded flops via one or more programmable delay elements. In some aspects, clock monitoring circuit may further include an encoder coupled to outputs of the cascaded flops and configured to generate an encoded output value that represents the outputs of the cascaded flops, a comparator configured to generate and store an interrupt when the encoded output value does not match a programmed value, and an error correction code generator configured to generate and store an error correction code for each stored interrupt.

In some aspects, the plurality of cascaded flops and programmable delay elements may be configured so that the clock to be monitored is evaluated at least once in every fault tolerant time interval (FTTI). In some aspects, the system on chip may be configured to be included in a control system of a vehicle. In some aspects, the system on chip may be configured to be used to control an operation of an Advanced Driver Assistance System (ADAS) configured to be included in a motor vehicle. In some aspects, the system on chip may include a system clock, and the clock monitoring circuit may further include a built-in self-test selector component that is coupled to the system clock and to the clock to be monitored. In some aspects, the error correction code generator may be configured to generate the error correction code in response to determining that the interrupt has been stored in a status register. In some aspects, the error correction code generator may be further configured to generate a second error correction code in response to determining that information has been written to a configuration register. In some aspects, the clock monitoring circuit may further include a manager component configured to generate an error signal based on the interrupt and the error correction code. In some aspects, the clock monitoring circuit may further include a manager component configured to determine whether the clock to be monitored is operating correctly without the use of another clock in the system on chip.

BRIEF DESCRIPTION OF THE DRAWINGS

The accompanying drawings, which are incorporated herein and constitute part of this specification, illustrate exemplary aspects of the claims, and together with the general description given above and the detailed description given below, serve to explain the features of the claims.

DETAILED DESCRIPTION

Figure 1:
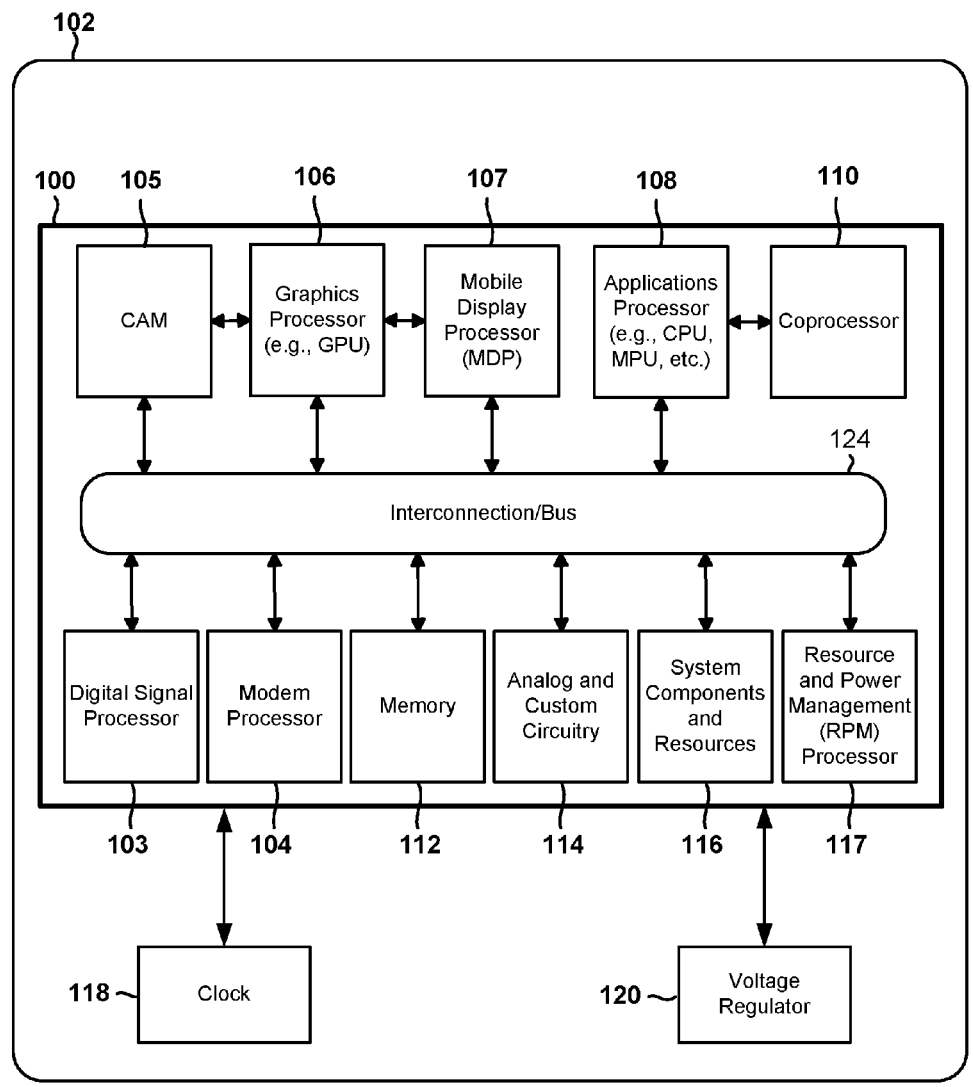
FIG. 1 is a block diagram illustrating components of an example system on chip that may be included in an aspect computing device and configured to use monitor a clock in accordance with various aspects.

The various aspects will be described in detail with reference to the accompanying drawings. Wherever possible, the same reference numbers will be used throughout the drawings to refer to the same or like parts. References made to particular examples and implementations are for illustrative purposes, and are not intended to limit the scope of the claims.

The various aspects include ultra-fast, safe, and secure autonomous clock monitoring units, circuits, and/or components that are suitable for monitoring critical clocks in a computerized system accurately, efficiently, and securely without the use of a reference clock. The various aspects overcome many of the limitations of conventional solutions, and as a result, are well suited for inclusion and use in current and future automotive applications, such as the SOCs that include or implement a vehicle's advanced driver assistance system (ADAS), which is responsible for controlling or automating the vehicle's operation.

Clock monitoring is an important and critical aspect of the computerized systems that control the operations of a vehicle, such as the SOCs that include or implement a vehicle's advanced driver assistance system (ADAS). However, conventional clock monitoring solutions are not adequate for use in automotive applications. This is because conventional clock monitoring solutions are not fast enough and not secure enough for use in automotive systems, and do not adequately comply with many relevant and important automotive safety standards and requirements.

Many conventional clock monitoring solutions require the use of a reference clock. Such conventional solutions compare the output of a monitored clock to the output of the reference clock to identify inconsistencies or abnormalities. However, the reference clock has the same limitations as the clock being monitored. For example, the reference clock is susceptible to the same types of malfunctions and attacks as the clock being monitored, the reference clock must always remain the running state, the reference clock must always be accurate, etc. Further, the inclusion and use of a reference clock may be an inefficient use of the system's limited resources, and typically slows or limits the system's performance and responsiveness. For example, solutions using a reference clock may require the use of two counters (e.g., one for each clock), require software to poll the counters at regular intervals, require between 30 to 40 cycles (depending on the clock frequency) for the comparison, etc. For these and other reasons, conventional solutions are not adequate for use in automotive applications.

For automotive applications (e.g., ADAS), there are a number of safety standards that must be met by the vehicle's computerized components. For example, each vendor or manufacturer may define a fault tolerant time interval (FTTI) during which any abnormality (e.g., variation, glitch, etc.) should to be detected, flagged, and reported. For example, critical clocks for automotive applications should be monitored at least once in every interval (e.g., FTTI of 200 milliseconds, etc.) to ensure that the clocks are operating correctly or as expected. This safety requirement ensures that the system/vehicle has sufficient time to take a corrective action before an abnormally causes a catastrophic failure (e.g., a malfunction in the braking or steering systems, etc.). Conventional clock monitoring solutions are not sufficiently fast or efficient to monitor a clock once every fault tolerant time interval (FTTI) without the monitoring operations causing a significant negative impact on the system's performance or responsiveness.

Generally, any variation in the waveform or frequency of a critical clock in a computerized system could cause a failure. Since modern automobiles rely on such computerized systems to control many of their operations (e.g., braking, steering, etc.), such a failure could result in a collision, property damage, or a loss of life. Therefore, it is important to repeatedly or continuously monitor the critical clocks in automobile systems to ensure that the clocks are operating correctly or as expected (e.g., without variations or glitches, etc.). Further, due to the speed at which automobiles may travel and the significant risk automobiles pose to human lives, it is also important to identify, report, and respond to such variations or abnormalities quickly and efficiently.

In addition to causing failures, any variation in clock frequency or waveform (or other inconsistencies) could be used for, or may be a result of, an attack, such as a security hack. For example, undetected variations may allow a hacker or attacker to launch a fault injection or "clock glitching" attack. Such attacks could be used to alter the execution flow of software and, potentially, allow an attacker to introduce and/or execute malware (or an unintended/erroneous code path) in the device/system. In modern automobiles, such an attack could cause a vehicle's processors and/or SOCs to malfunction, causing a collision or accident. Such an attack could also provide an attacker with access to personal and/or confidential information, such as the driver's current location, whether the driver is currently away from home, etc.

Thus, clock monitoring is important for preventing failures as well as maintaining the system's safety and security. For these reasons, the clock monitor should be configured so that it is not susceptible to attacks. For example, in order to avoid detection, an attacker may attempt to disable or modify a clock monitor so that the clock monitor is not able to detect a variation or abnormality caused/used by the attack.

The various aspects include a clock monitoring unit/component that may be configured to repeatedly/continuously monitor a clock with the speed required to support automobile automation systems (e.g., ADAS components) without the use of a reference clock. The clock monitoring unit/component may be configured to identify, report, and/or respond to variations or abnormalities in the monitored clock. The clock monitoring unit/component may detect a variation in the waveform or frequency of a clock and initiate an action (e.g., by issuing an interrupt that a processor may react to) to prevent the variation from causing or resulting in a failure or a vulnerability to attack. Further, the clock monitoring unit/component in the various aspects may be configured, organized, or arranged to operate so that the circuit is immune or resistant to manipulation, modification, tampering, hacks, and other attacks.

In various aspects, the clock monitoring unit/component may be configured, organized, or arranged to operate with sufficient accuracy, speed, and efficiency so that the circuit can monitor a clock once every fault tolerant time interval (FTTI). As a result, the clock monitoring unit/component may detect and respond to abnormalities without the operations having a negative impact on the system's performance or responsiveness.

In some aspects, the clock monitoring unit/component may include self test capabilities that allow the circuit to evaluate itself and determine whether the circuit is operating correctly or as expected. The clock monitoring unit/component may be configured to perform a self test on-demand and/or at user-programmable or periodic intervals. In addition, the clock monitoring unit/component may be configured so that performance of the self test and results generated by the self test are immune or resistant to manipulation, modification, tampering, hacks, and other attacks.

In some aspects, the clock monitoring unit/component may include a clock monitoring circuit that includes a plurality of cascaded flops in which a clock input of each flop is the same as a clock to be monitored. The data input of each flop may be driven by a divided version of the clock being monitored so that the data input to each of the plurality of cascaded flops is delayed relative to other cascaded flops via one or more programmable delay elements. The clock monitoring circuit may also include an encoder component that is coupled to the outputs of the cascaded flops. The encoder component may be configured to generate an encoded output value that represents the outputs of the cascaded flops. The clock monitoring circuit may also include a comparator component that is coupled to the encoder component. The comparator component may be configured to generate and store an interrupt value/signal in response to determining that the encoded output value (from the encoder component) does not match a programmed value. In some aspects, the clock monitoring circuit may further include an error correction code generator that is coupled to the comparator component. The error correction code generator may be configured to generate and store an error correction code for each stored interrupt.

In some aspects, the plurality of cascaded flops and programmable delay elements may be included in the clock monitoring component and arranged or configured so that the "clock to be monitored" is monitored, evaluated, or tested at least once in every fault tolerant time interval (FTTI), such as once every 200 milliseconds. In an aspect, the clock to be monitored may a clock included in or configured to be used in a control system of a motor vehicle. In an aspect, the clock to be monitored may a clock that is included in a system on chip (SOC) configured to control an operation of an Advanced Driver Assistance System (ADAS) included in or configured to be used in a motor vehicle, such as an autonomous vehicle.

In some aspects, the clock monitoring circuit may include a built-in self-test selector component that is coupled to a system clock and the clock to be monitored. In an aspect, the error correction code generator may be configured to generate an error correction code in response to determining that the interrupt has been stored in a status register and/or in response to determining that information has been written to a configuration register.

In some aspects, the clock monitoring circuit may include a manager component that may be configured to determine whether the clock to be monitored is operating correctly without the use of a reference clock, and generate an error or fault signal in response to determining, based on the interrupt and the error correction code, that the monitored clock is not operating correctly or as expected.

The various aspects may be implemented and/or included in a number of single processor and multiprocessor computer systems, including a system-on-chip (SOC). FIG. 1 illustrates an example system-on-chip (SOC) 100 architecture that may be used in computing devices implementing the various aspects. The SOC 100 may include a number of heterogeneous processors, such as a digital signal processor (DSP) 103, a modem processor 104, a graphics processor 106, a mobile display processor (MDP) 107, an applications processor 108, and a resource and power management (RPM) processor 117. The SOC 100 may also include one or more coprocessors 110 (e.g., vector co-processor) connected to one or more of the heterogeneous processors 103, 104, 106, 107, 108, 117. Each of the processors may include one or more cores, and an independent/internal clock. Each processor/core may perform operations independent of the other processors/cores. For example, the SOC 100 may include a processor that executes a first type of operating system (e.g., FreeBSD, LINUX, OS X, etc.) and a processor that executes a second type of operating system (e.g., Microsoft Windows). In some aspects, the applications processor 108 may be the SOC's 100 main processor, central processing unit (CPU), microprocessor unit (MPU), arithmetic logic unit (ALU), etc. The graphics processor 106 may be graphics processing unit (GPU).

The SOC 100 may include analog circuitry and custom circuitry 114 for managing sensor data, analog-to-digital conversions, wireless data transmissions, and for performing other specialized operations, such as processing encoded audio and video signals for rendering in a web browser. The SOC 100 may further include system components and resources 116, such as voltage regulators, oscillators, phase-locked loops, peripheral bridges, data controllers, memory controllers, system controllers, access ports, timers, and other similar components used to support the processors and software clients (e.g., a web browser) running on a computing device. The SOC 100 also include specialized circuitry (CAM) 105 that includes, provides, controls, and/or manages the operations of one or more cameras (e.g., a primary camera, webcam, 3D camera, etc.), the video display data from camera firmware, image processing, video preprocessing, video front-end (VFE), in-line JPEG, high definition video codec, etc. The CAM 105 may be an independent processing unit and/or include an independent or internal clock.

The system components and resources 116, custom circuitry 114, and/or CAM 105 may include circuitry to interface with peripheral devices, such as cameras, electronic displays, wireless communication devices, external memory chips, etc. The processors 103, 104, 106, 107, 108 may be interconnected to one or more memory elements 112, system components, and resources 116, custom circuitry 114, CAM 105, and RPM 117 via an interconnection/bus module 124, which may include an array of reconfigurable logic gates and/or implement a bus architecture (e.g., CoreConnect, AMBA, etc.). Communications may be provided by advanced interconnects, such as high performance networks-on chip (NoCs).

The SOC 100 may further include an input/output module (not illustrated) for communicating with resources external to the SOC, such as a clock 118 and a voltage regulator 120. Resources external to the SOC (e.g., a clock 118 or a voltage regulator 120) may be shared by two or more of the internal SOC processors/cores (e.g., a DSP 103, a modem processor 104, a graphics processor 106, an applications processor 108, etc.).

In an aspect, the SOC 100 may be included in a computing device 102, which may be included in an automobile. The computing device 102 may include communication links for communication with a telephone network, the Internet, and/or a network server. Communication between the computing device 102 and the network server may be achieved through the telephone network, the Internet, private network, or any combination thereof.

The SOC 100 may also include additional hardware and/or software components that are suitable for collecting sensor data from sensors, including speakers, user interface elements (e.g., input buttons, touch screen display, etc.), microphone arrays, sensors for monitoring physical conditions (e.g., location, direction, motion, orientation, vibration, pressure, etc.), cameras, compasses, Global Positioning System (GPS) receivers, communications circuitry (e.g., Bluetooth®, WLAN, Wi-Fi, etc.), and other well-known components (e.g., accelerometer, etc.) of modern electronic devices.

In addition to the computing device 102 and SOC 100 discussed above, the various aspects may be implemented in a wide variety of computing systems, which may include a single processor, multiple processors, multicore processors, or any combination thereof.

Figure 2:
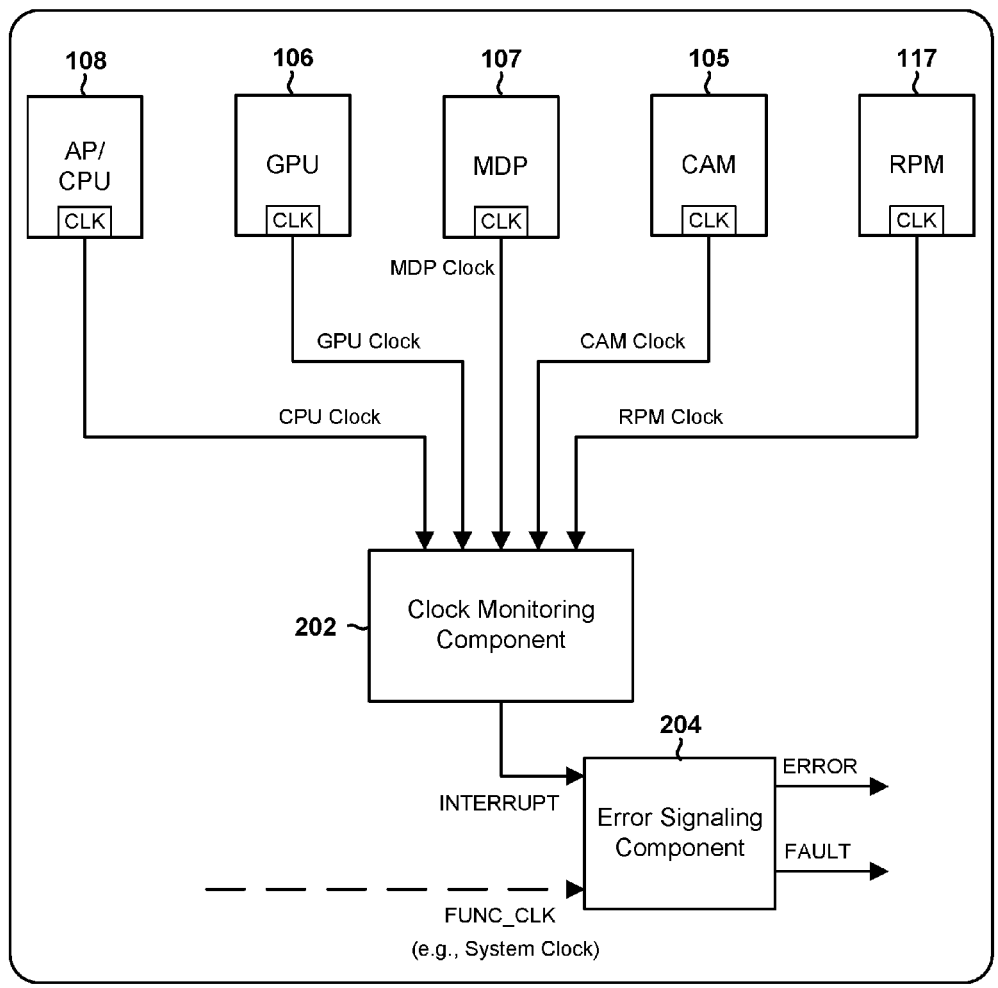
FIGS. 2 and 3 illustrate example clock monitoring systems that are suitable for use in an automotive application in accordance with various aspects.

FIG. 2 illustrates an example clock monitoring system that is suitable for use in providing safe and secure applications, such as automotive and ADAS applications, in accordance with the various aspects. In the example illustrated in FIG. 2, the system includes an applications processor (AP/CPU) 108, a graphics processor (GPU) 106, a MDP 107, a CAM 105, a RPM 117, a clock monitoring unit/component 202, and an error signaling component 204 (any or all of which may be included in the SOC 100 discussed above). Each of the AP/CPU 108, GPU 106, MDP 107, CAM 105, and RPM 117 may include an independent clock that requires monitoring. As such, the clock output of each of these components may be coupled to the clock monitoring unit/component 202.

The clock monitoring unit/component 202 may be configured to receive a variety of clock inputs, such as the illustrated CPU Clock, GPU Clock, MDP Clock, CAM Clock, and RPM Clock. The clock monitoring unit/component 202 may be configured to generate an interrupt output (INTERRUPT) based on one or more of the clock inputs (e.g., CPU Clock, GPU Clock, MDP Clock, CAM Clock, RPM Clock), and send the interrupt output to the error signaling component 204.

The error signaling component 204 may be configured to receive the interrupt output (INTERRUPT) and a system clock input (FUNC_CLK). The error signaling component 204 may generate an error output (ERROR) and/or a fault output (FAULT). The error signaling component 204 may send the generated output (ERROR, FAULT, etc.) to the AP/CPU 108 (or MPU, fault aggregator, or any other on-board processing unit) to initiate corrective actions/operations, such as operations for shutting down the SOC 100, restarting the device, etc.

Figure 3:
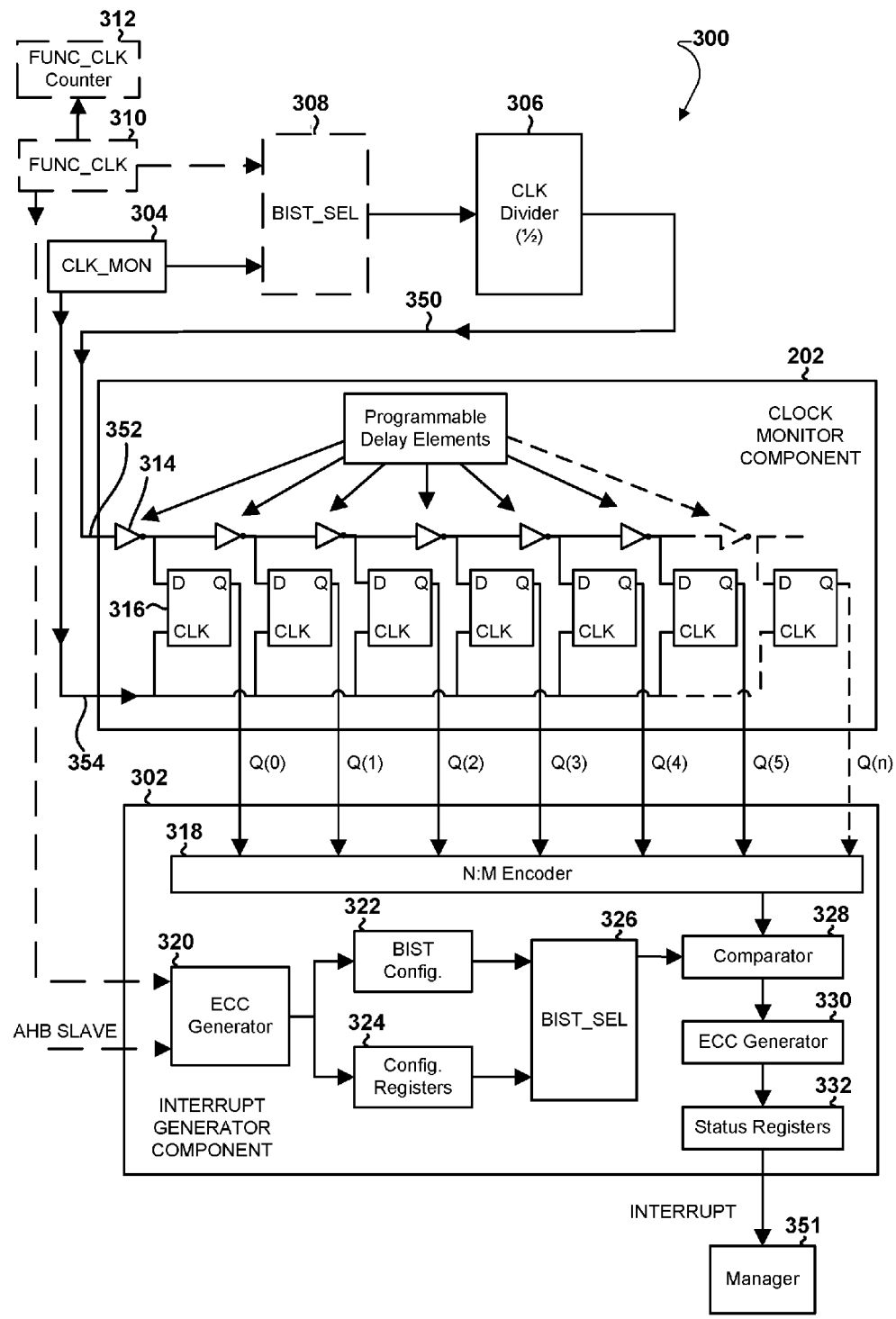

FIG. 3 illustrates another example clock monitoring system 300 that is suitable for use in providing safe and secure applications in accordance with the various aspects. In the example illustrated in FIG. 3, the clock monitoring system 300 includes a clock monitoring component 202, an interrupt generator component 302, a monitored clock (CLK_MON) 304, and a clock divider component (CLK Divider) 306. The clock monitoring component 202 may include programmable delay elements 314 and D flip-flops 316. The interrupt generator component 302 may include an encoder component (N:M Encoder) 318, an error correction code (ECC) generator component 320, a built-in self-test (BIST) configuration component 322, configuration registers 324, a BIST selector component (BIST_SEL) 326, a second ECC generator component 330, and status registers 332.

In some aspects, the second ECC generator component 330 may be included in, implemented as part of, or the same component as the ECC generator component 320. In some aspects, the interrupt generator component 302 may be included in, implemented as part of, or the same component as, the clock monitoring component 202. In some aspects, the clock monitoring system 300 may optionally include (or have access to) a system clock (FUNC_CLK) 310, a system clock counter (FUNC_CLK Counter) 312, and a second BIST selector component (BIST_SEL) 308.

The D flip-flops 316 in the clock monitoring component 202 may be cascaded, and the "D" or "data" input of each flip-flop 316 may be set, such that the data going to each subsequent flip-flop 316 is incrementally delayed by a programmable delay element 314. That is, the programmable delay elements 314 may be included in the D line so that each programmable delay element introduces a delay between each flip-flop 316 and the next. At any time, the Q output of each individual flip-flop 316, Q(0)-Q(n), may be set or clear (one or zero, etc.) based on the value on the D line and the number of intervening programmable delay elements 314. The clock input of each flip-flop 316 may be coupled to the output of monitored clock (CLK_MON) 304.

The monitored clock (CLK_MON) 304 may be coupled, directly or indirectly, to the clock divider component (CLK Divider) 306 and to a second input line 354 of the clock monitoring component 202. The clock divider component (CLK Divider) 306 may divide the output of the monitored clock (CLK_MON) 304 in half or by two to generate a pulse 350, which is fed as an input to a first input line 352 of the clock monitoring component 202.

The encoder component (N:M Encoder) 318 in the interrupt generator component 302 may be configured to receive the output of the flip-flops 316 (i.e., Q(0)-Q(n)), and use this information to generate an encoded value. The comparator component 328 may be configured to receive and compare the encoded value to programmed or preprogrammed value (stored in memory, etc.). If the encoded value is not as expected (i.e., the encode value does not match the programmed value, etc.), this indicates that there is a manipulation, variation, or abnormality in the in monitored clock (CLK_MON) 304.

The second BIST selector component (BIST_SEL) 308 may be configured to perform the built in self test at every power up, periodically, or on demand (e.g., when the user wants, etc.). In addition, the second BIST selector component (BIST_SEL) 308 may be configured to select either the monitored clock (CLK_MON) 304 or the system clock (FUNC_CLK) 310 as the input to the clock divider component (CLK Divider) 306 and generation of the pulse 350. Since the system clock (FUNC_CLK) 310 is a known clock/value, the clock/value may be used to generate the pulse 350 and self-test the operations of the components (e.g., encoder 318, comparator 328, etc.) and/or the validity of the programmed value. The system clock counter (FUNC_CLK Counter) 312 may be polled periodically to ensure that the system clock (FUNC_CLK) 310 is running and operating as expected. This operation provides the system with an additional safety feature/capability that is not available via conventional clock monitoring solutions.

The ECC generators 320, 330 may be configured to generate an ECC on the write data/line each time that information is written to the configuration registers 324 (e.g., via an Advanced High-performance Bus (AHB) slave, etc.) or an interrupt is written to the status registers 332. The ECC may be stored in memory along with the data in the same registers, and subsequently used to validate the data. For example, if the configuration registers 324 are hacked, any application that reads information from the configuration registers 324 could determine that the read information is not consistent with its corresponding ECC, and is therefore not valid or corrupt. This configuration provides the system with additional security features and capabilities that are not available on conventional clock monitoring solutions.

Thus, the system 300 includes cascaded flops in which the "D" of each flop is driven by a divided version of the clock to be monitored, and the data "D" to each flop is delayed by a configurable delay. The number of delay buffers may be configurable to allow for monitoring a wide range of frequencies. Depending on the pulse width of the divided clock output (i.e., pulse 350), a certain number of flops will be set. The encoder 318 may provide an encoded value of the number of flops for which the output Q is "SET." The encoded value may be compared against the programmed value via the comparator 328, and in the case of a mismatch, an interrupt may be generated and provided to a component (e.g., to a fault aggregator, etc.). The interrupt may also be stored in status registers 332. These operations may allow the system to monitor the clock much faster than conventional clock monitoring solutions.

In some aspects, the system 300 may also include a manager component 351 that is configured to receive and use the interrupt signal generated by the interrupt generator component 302 to determine whether the monitored clock (CLK_MON) 304 is operating correctly or as expected. Due to the configuration of the elements in the clock monitoring component 202 and interrupt generator component 302, the manager component 351 may accomplish this without the use of a second or reference clock. That is, the manager component 351 may determine whether the monitored clock (CLK_MON) 304 is operating correctly or as expected based on only the output of the monitored clock (CLK_MON) 304.

Figure 4:
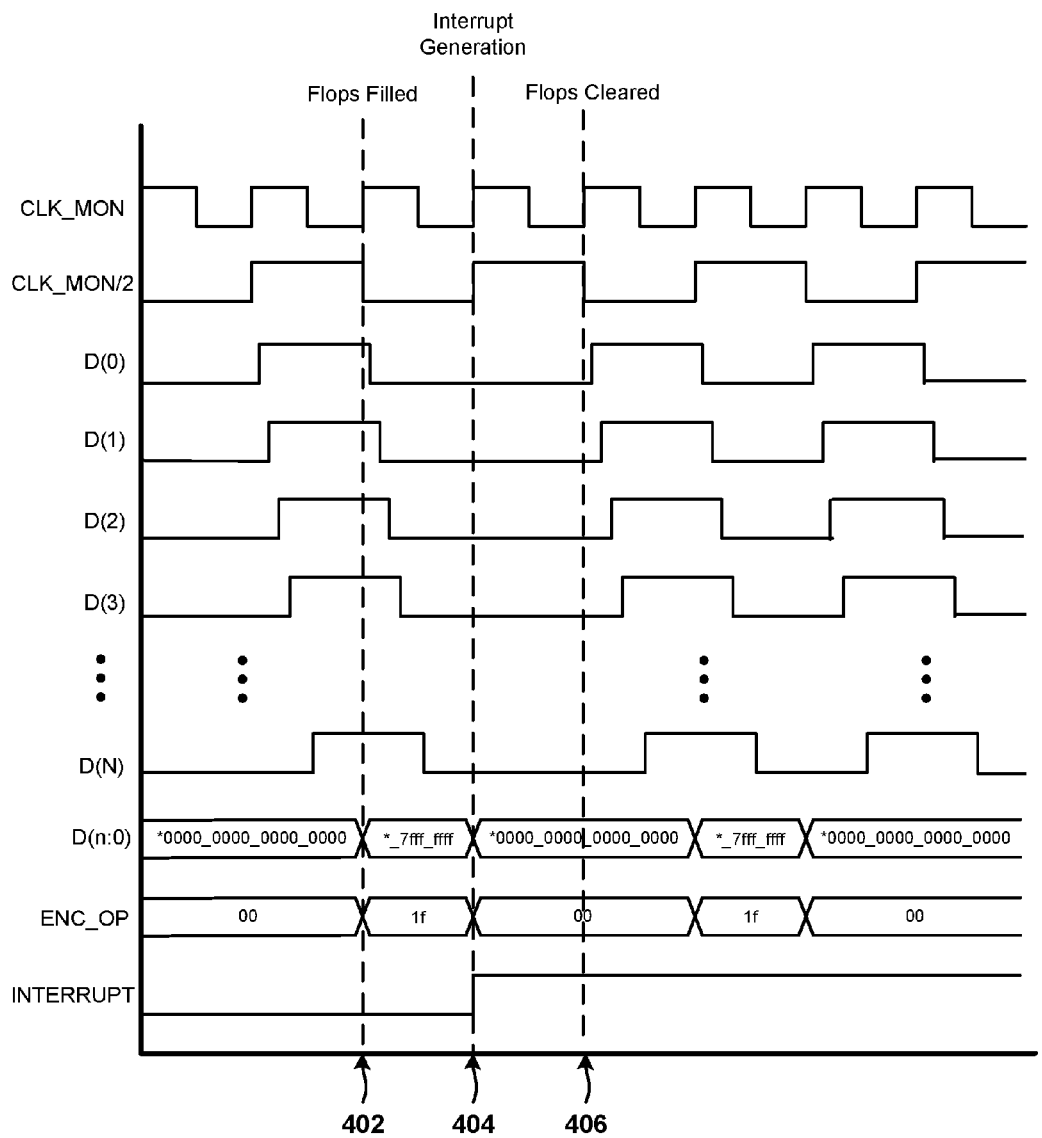
FIG. 4 is a timing diagram of a clock monitoring system that may be used in an automotive application in accordance with an aspect.

FIG. 4 is a timing diagram that illustrates the operations of an example clock monitoring system (e.g., clock monitoring system 300) that is suitable for use in providing safe and secure applications in accordance with an aspect. In the example illustrated in FIG. 4, CLK_MON is the signal of the clock that is monitored (e.g., monitored clock 304 discussed above). CLK_MON/2 is the signal of the clock (CLK) divider component (e.g., CLK divider 306). D(0) through D(N) are the signals from the Q outputs of the flip flops. D(n:0) is the value output by the encoder (e.g., encoder component 318). ENC_OP is the selected programmed or preprogrammed value used by the comparator (e.g., comparator component 328). INTERRUPT is the signal generated by the interrupt generator component 302 when the encoded value (e.g., D(n:0)) does not match the programmed value (e.g., ENC_OP).

FIG. 4 illustrates that, when the flops are filled at time 402, the value of D(n:0) updates to *_7fff_ffff and the value of the programmed value updates to 1f. The system detects that there is a mismatch between these values, and at time 404, an interrupt is generated (i.e., INTERRUPT is set or high). As a result, flops are D(0) through D(N) cleared and the process starts anew at time 406.

Figure 5:
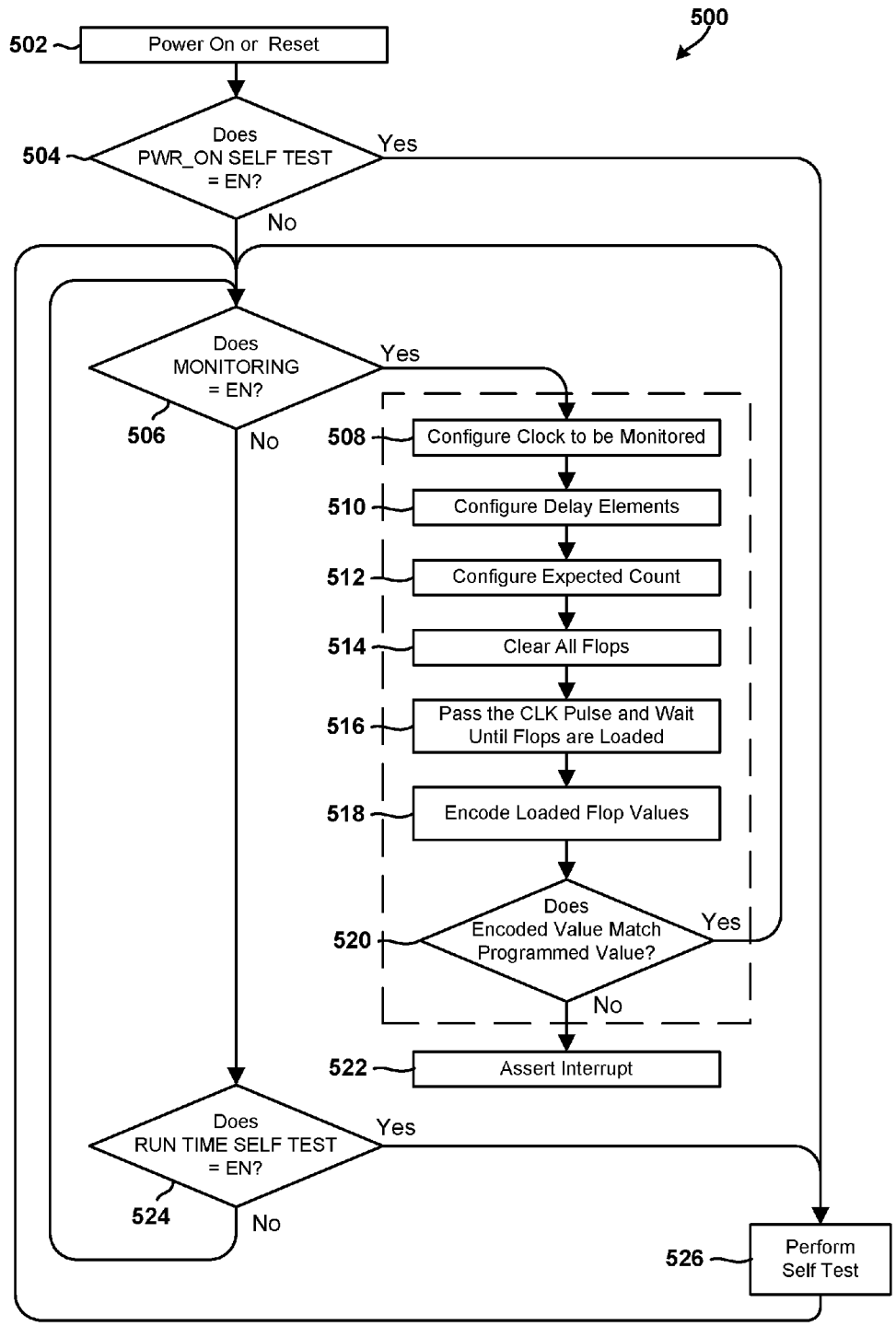
FIGS. 5 and 6 are processor flow diagrams that illustrate a method of monitoring a clock in accordance with an aspect.

FIG. 5 illustrates a method 500 for performing clocking monitoring by a computing device (e.g., the computing device 102 described with reference to FIG. 1) using a circuit monitoring unit/component (e.g., the circuit monitoring unit/component 202 described with reference to FIGS. 2 and 3) in accordance with various aspects. In block 502, the circuit monitoring unit/component in the computing device may power on the device or reset.

In determination block 504, the circuit monitoring unit/component may determine whether the power-on self test is enabled. In some aspects, this may be accomplished by testing a power-on-self-test bit or flag. In some aspects, the power-on-self test bit may be a programmable and/or user controllable bit. In some aspects, the power-on-self test bit may be set to "on" or "enabled" based on user input/programming.

In response to determining that the power-on self test is not enabled (i.e., determination block 504="No"), the circuit monitoring unit/component may determine whether monitoring is enabled in determination block 506. In some aspects, this may be accomplished by testing a "monitor enabled" bit or flag. In some aspects, the monitor enabled bit may be a programmable and/or user controllable bit. In some aspects, the monitor enabled may be set to "on" or "enabled" based on user input/programming.

In response to determining that monitoring is enabled (i.e., determination block 506="Yes"), the circuit monitoring unit/component may configure the clock to be monitored in block 508. In some aspects, as part of the operations in block 508, the circuit monitoring unit/component may perform clock selection operations to select one of multiple system clocks for monitoring. The circuit monitoring unit/component may select a clock for monitoring dynamically, intelligently, and/or based on user input or configuration.

In block 510, the circuit monitoring unit/component may configure delay elements. As part of these operations, the circuit monitoring unit/component may select delay elements for loading. In some aspects, configuring delay elements may include "delay selection," "load selection," and/or the selection for loading at the output of every delay element. This delay selection may affect the delay of the buffers. This load selection may be programmable. The delay elements may be configured to a known loading value such that for a given clock frequency, the flip flops produce an expected or predicted count value.

In block 512, the circuit monitoring unit/component may configure the expected count, which may be the value of the output(s) of the flip flop(s) when provided with a clock of known frequency under a given delay/loading condition.

In block 514, the circuit monitoring unit/component may clear all the flops. In block 516, the circuit monitoring unit/component may pass the clock pulse through the plurality of delay elements and the plurality of flops and wait until the flops are loaded.

In block 518, the circuit monitoring unit/component may encode loaded flop values to generate an encoded value. The encoded value may be binary number that encodes or summarizes the flop values in a compact format as described above with reference to FIG. 4.

In determination block 520, the circuit monitoring unit/component may determine whether the encoded value matches a programmed value, such as by comparing the encoded value to the programmed value. The expected value may be a value in accordance with a known clock frequency and a particular delay configuration. In some aspects, the system may operate in real time so that the comparison flags an error when the clock frequency changes.

In response to determining that the encoded value matches the programmed value (i.e., determination block 520="Yes"), the circuit monitoring unit/component may repeat the operations in blocks 506-522. Thus, the monitored clock is determined to be performing within tolerance when the encoded value matches the programmed value.

In response to determining that the encoded value does not match the programmed value (i.e., determination block 520="No"), the circuit monitoring unit/component may generate an interrupt in block 522. Thus, an error in the monitored clock may be indicated when the encoded value does not match the programmed value.

Returning to determination block 506, in response to determining that monitoring is not enabled (i.e., determination block 506="No"), the circuit monitoring unit/component may determine whether a run time self test is enabled in determination block 524.

In response to determining that the run time self test is not enabled (i.e., determination block 524="No") the circuit monitoring unit/component may again determine whether monitoring is enabled in determination block 506.

In response to determining that the power-on self test is enabled (i.e., determination block 504="Yes") or that the run time self test is enabled (i.e., determination block 524="Yes") the circuit monitoring unit/component may perform a self test in block 526. Following the self test, the circuit monitoring unit/component may determine whether monitoring is enabled in determination block 506 and proceed as described above.

Figure 6:
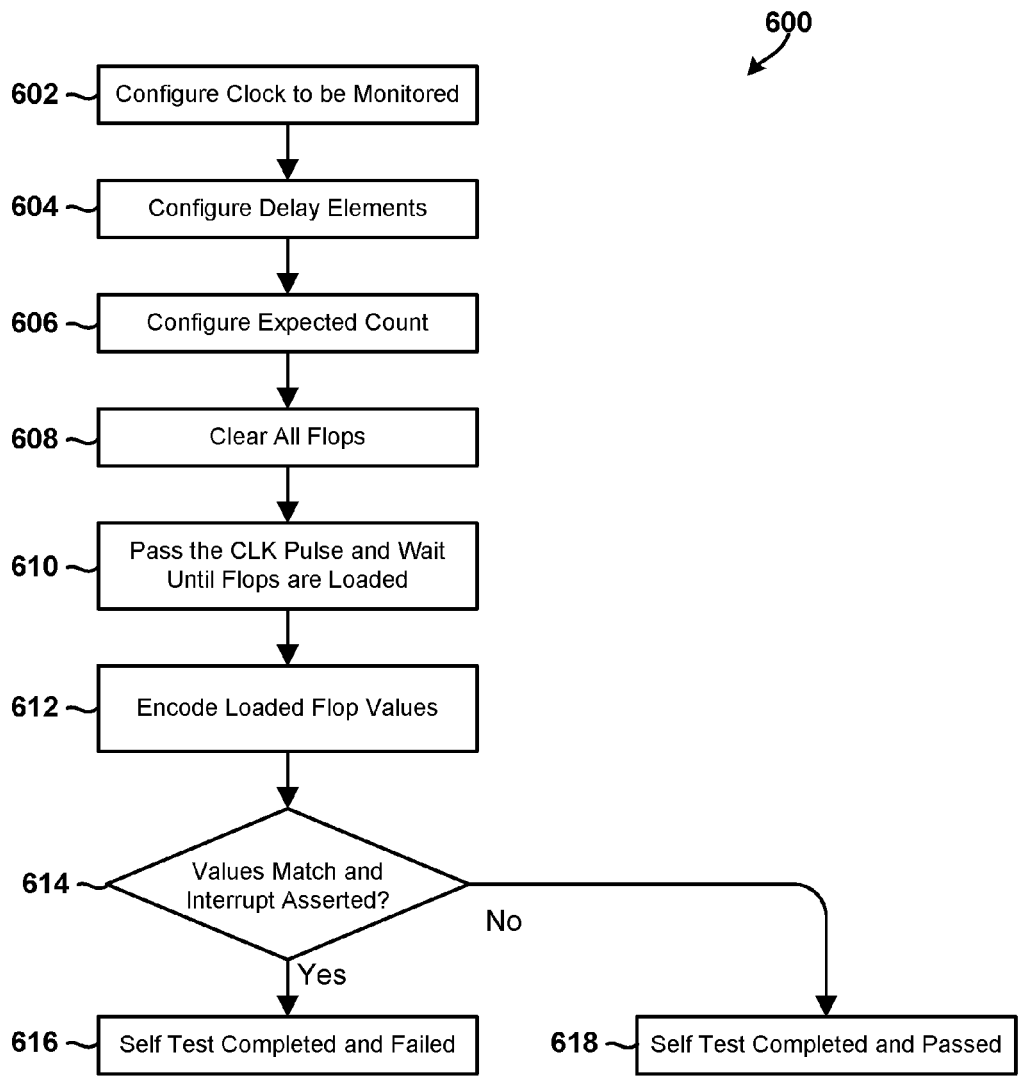

FIG. 6 illustrates a method 600 for performing a self check in accordance with an aspect. The operations of the method 600 may be performed as part of the operations of block 526 illustrated in FIG. 5. Some of the operations of the method 600 may be performed by a processor (e.g., any of the applications processor 108, coprocessor 110, digital signal processor 103, modem processor 104 or the RPM processor 117 described with reference to FIG. 1) while other operations may be performed by dedicated hardware, such as the clock monitor component 202 described with reference to FIGS. 2 and 3.

In block 602, the circuit monitoring unit/component may configure a known clock (e.g., a system clock, FUNC_CLK, etc.).

In block 604, the circuit monitoring unit/component may configure the delay elements.

In block 606, the circuit monitoring unit/component may configure the expected count.

In block 608, the circuit monitoring unit/component may clear all the flops. In block 610, the circuit monitoring unit/component may generate a clock pulse (e.g., FUNC_CLK) and wait until the flops are loaded.

In block 612, the circuit monitoring unit/component may encode loaded flop values to generate an encoded value that is a binary number encoding or summarizing the loaded flop values.

In determination block 614, the circuit monitoring unit/component may determine whether the encoded value matches the expected count and whether an interrupt has been asserted.

In response to determining that encoded value matches the expected count and an interrupt has been asserted (i.e., determination block 614="Yes"), the circuit monitoring unit/component may determine that the self test is complete and failed in block 616.

In response to determining that the encoded value does not matches the expected count, or that encoded value matches the expected count and an interrupt has not been asserted (i.e., determination block 614="No"), the circuit monitoring unit/component may determine that the self test is complete and passed in block 618. When the self test is complete, the circuit monitoring unit/component may execute the operations of the method 500

Figure 7:
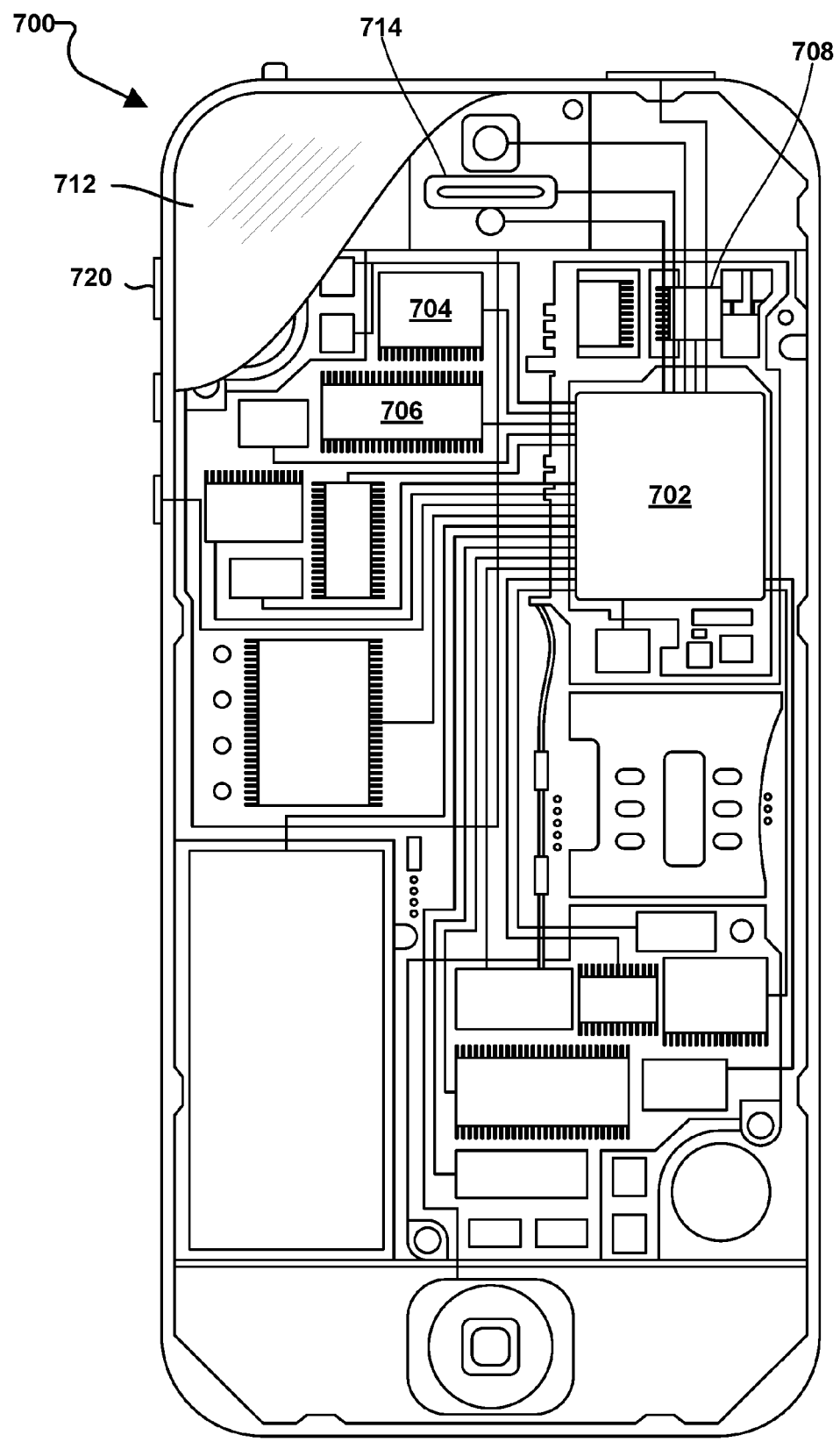
FIG. 7 is a component block diagram of a mobile device suitable for use in an aspect.

The various aspects may be implemented on a variety of computing devices, an example of which is illustrated in FIG. 7 in the form of a smartphone. A smartphone 700 may include a processor 702 coupled to internal memory 704, a display 712, and to a speaker 714. Additionally, the smartphone 700 may include an antenna for sending and receiving electromagnetic radiation that may be connected to a wireless data link and/or cellular telephone transceiver 708 coupled to the processor 702. Smartphones 700 typically also include menu selection buttons or rocker switches 720 for receiving user inputs.

A typical smartphone 700 also includes a sound encoding/decoding (CODEC) circuit 706, which digitizes sound received from a microphone into data packets suitable for wireless transmission and decodes received sound data packets to generate analog signals that are provided to the speaker to generate sound. Also, one or more of the processor 702, wireless transceiver 708 and CODEC 706 may include a digital signal processor (DSP) circuit (not shown separately).

The processors 702 may be any programmable microprocessor, microcomputer or multiple processor chip or chips that can be configured by software instructions (applications) to perform a variety of functions, including the functions of the various aspects described below. In some mobile devices, multiple processors 702 may be provided, such as one processor dedicated to wireless communication functions and one processor dedicated to running other applications. Typically, software applications may be stored in the internal memory 704 before they are accessed and loaded into the processor 702. The processor 702 may include internal memory sufficient to store the application software instructions.

The foregoing method descriptions and the process flow diagrams are provided merely as illustrative examples, and are not intended to require or imply that the steps of the various aspects must be performed in the order presented. As will be appreciated by one of skill in the art the order of steps in the foregoing aspects may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

As used in this application, the terms "component," "comparator," "encoder," "element" "system," and the like are intended to include a computer-related entity, such as, but not limited to, hardware, firmware, a combination of hardware and software, software, or software in execution, which are configured to perform particular operations or functions. For example, a component may be, but is not limited to, a process running on a processor, a processor, an object, an executable, a thread of execution, a program, and/or a computer. By way of illustration, both an application running on a computing device and the computing device may be referred to as a component. One or more components may reside within a process and/or thread of execution, and a component may be localized on one processor or core and/or distributed between two or more processors or cores. In addition, these components may execute from various non-transitory computer readable media having various instructions and/or data structures stored thereon. Components may communicate by way of local and/or remote processes, function or procedure calls, electronic signals, data packets, memory read/writes, and other known network, computer, processor, and/or process related communication methodologies.

The various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the claims.

The hardware used to implement the various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a multiprocessor, but, in the alternative, the processor may be any conventional processor, controller, microcontroller, or state machine. A processor may also be implemented as a combination of computing devices, e.g., a combination of a DSP and a multiprocessor, a plurality of multiprocessors, one or more multiprocessors in conjunction with a DSP core, or any other such configuration. Alternatively, some steps or methods may be performed by circuitry that is specific to a given function.

In one or more exemplary aspects, the functions described may be implemented in hardware, software, firmware, or any combination thereof. If implemented in software, the functions may be stored as one or more processor-executable instructions or code on a non-transitory computer-readable storage medium or non-transitory processor-readable storage medium. The steps of a method or algorithm disclosed herein may be embodied in a processor-executable software module, which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed aspects is provided to enable any person skilled in the art to make or use the claims. Various modifications to these aspects will be readily apparent to those skilled in the art, and the generic principles defined herein may be applied to other aspects without departing from the scope of the claims. Thus, the claims are not intended to be limited to the aspects shown herein but are to be accorded the widest scope consistent with the following claims and the principles and novel features disclosed herein.

What is claimed is:

1. A clock monitoring circuit, comprising:
   a plurality of cascaded flops in which a clock input of each flop is the same as a clock to be monitored, a data input of each flop is driven by a divided version of the clock being monitored so that the data input to each of the plurality of cascaded flops is delayed relative to other cascaded flops via one or more programmable delay elements;
   an encoder coupled to outputs of the cascaded flops and configured to generate an encoded output value that represents the outputs of the cascaded flops;
   a comparator configured to generate and store an interrupt when the encoded output value does not match a programmed value; and
   an error correction code generator configured to generate and store an error correction code for each stored interrupt.

2. The clock monitoring circuit of claim 1, wherein the plurality of cascaded flops and programmable delay elements are included in a clock monitoring component and configured so that the clock to be monitored is evaluated at least once in every fault tolerant time interval (FTTI).

3. The clock monitoring circuit of claim 1, wherein the clock to be monitored is a clock that is included in a control system of a vehicle.

4. The clock monitoring circuit of claim 1, wherein the clock to be monitored is a clock that is included in a system on chip (SOC) configured to control an operation of an Advanced Driver Assistance System (ADAS) when included in a motor vehicle.

5. The clock monitoring circuit of claim 1, further comprising a built-in self-test selector component coupled to a system clock and the clock to be monitored.

6. The clock monitoring circuit of claim 1, wherein the error correction code generator is configured to generate the error correction code in response to determining that the interrupt has been stored in a status register.

7. The clock monitoring circuit of claim 6, wherein the error correction code generator is further configured to generate a second error correction code in response to determining that information has been written to a configuration register.

8. The clock monitoring circuit of claim 1, further comprising a manager component configured to generate an error signal based on the interrupt and the error correction code.

9. The clock monitoring circuit of claim 1, further comprising a manager component configured to determine whether the clock to be monitored is operating correctly without the use of a reference clock.

10. A system on chip, comprising:
    a clock to be monitored; and
    a clock monitoring circuit coupled to the clock to be monitored, wherein the clock monitoring circuit comprises:
    a plurality of cascaded flops in which a clock input of each flop is the same as the clock to be monitored, a data input of each flop is driven by a divided version of the clock being monitored so that a data input to each of the plurality of cascaded flops is delayed relative to other cascaded flops via one or more programmable delay elements;
    an encoder coupled to outputs of the cascaded flops and configured to generate an encoded output value that represents the outputs of the cascaded flops;
    a comparator configured to generate and store an interrupt when the encoded output value does not match a programmed value; and
    an error correction code generator configured to generate and store an error correction code for each stored interrupt.

11. The system on chip of claim 10, wherein the plurality of cascaded flops and programmable delay elements are configured so that the clock to be monitored is evaluated at least once in every fault tolerant time interval (FTTI).

12. The system on chip of claim 10, wherein the clock to be monitored is a clock that is configured to be included in a control system of a vehicle.

13. The system on chip of claim 10, wherein the clock to be monitored is a clock configured to be used to control an operation of an Advanced Driver Assistance System (ADAS) included in a motor vehicle.

14. The system on chip of claim 10, further comprising a system clock, wherein the clock monitoring circuit further comprises a built-in self-test selector component that is coupled to the system clock and to the clock to be monitored.

15. The system on chip of claim 10, wherein the error correction code generator is configured to generate the error correction code in response to determining that the interrupt has been stored in a status register.

16. The system on chip of claim 15, wherein the error correction code generator is further configured to generate a second error correction code in response to determining that information has been written to a configuration register.

17. The system on chip of claim 10, wherein the clock monitoring circuit further comprises a manager component configured to generate an error signal based on the interrupt and the error correction code.

18. The system on chip of claim 10, wherein the clock monitoring circuit further comprises a manager component configured to determine whether the clock to be monitored is operating correctly without the use of another clock in the system on chip.

* * * * *